United States Patent [19]

Frisina et al.

[11] Patent Number: 5,569,612

[45] Date of Patent: Oct. 29, 1996

[54] PROCESS FOR MANUFACTURING A BIPOLAR POWER TRANSISTOR HAVING A HIGH BREAKDOWN VOLTAGE

[75] Inventors: Ferruccio Frisina, Sant Agata Li Battiati; Salvatore Coffa, Trehestieri Etneu, both of Italy

[73] Assignee: Consorzio per la Ricerca sulla Microelettronica Nel Mezzogiorno, Catanai, Italy

[21] Appl. No.: 481,890

[22] Filed: Jun. 7, 1995

Related U.S. Application Data

[62] Division of Ser. No. 266,029, Jun. 27, 1994.

[30] Foreign Application Priority Data

Jun. 28, 1993 [EP] European Pat. Off. ............... 9380276

[51] Int. Cl.$^6$ .................................................. H01L 21/265
[52] U.S. Cl. ............................. 437/31; 437/143; 437/154; 148/DIG. 10
[58] Field of Search ........................ 437/31, 32, 143, 437/154, 909, 915, 917; 148/DIG. 10, DIG. 11, DIG. 33

[56] References Cited

U.S. PATENT DOCUMENTS

| | | |
|---|---|---|
| 4,074,293 | 2/1978 | Kravitz . |
| 4,154,632 | 5/1979 | Mochizuki et al. ............... 437/143 |
| 4,416,708 | 11/1983 | Abdoulin et al. ............... 437/154 |
| 4,559,696 | 12/1985 | Anand et al. . |
| 4,667,393 | 5/1987 | Ferln et al. . |
| 4,780,430 | 10/1988 | Musumeci et al. ............... 437/154 |
| 4,805,004 | 2/1989 | Gandalfi et al. . |
| 4,820,656 | 4/1989 | Schulze et al. ............... 437/143 |
| 4,999,309 | 3/1991 | Buynoski ............... 437/31 |
| 5,192,712 | 3/1993 | Aronowitz et al. ............... 437/143 |
| 5,436,179 | 7/1995 | Erdeljac et al. ............... 437/154 |

FOREIGN PATENT DOCUMENTS

| | | |
|---|---|---|
| 0439753 | 8/1991 | European Pat. Off. . |
| 2282721 | 3/1976 | France . |
| 2163597 | 2/1986 | United Kingdom . |

OTHER PUBLICATIONS

European Search Report from European Patent Application No. 93830276.7, filed Jun. 28, 1995.

Solid State Technology, vol. 19, Mar. 1976, Washington, US, pp. 29–32, A. H. Berman, "Glass Passivation Improves High Voltage Transistors".

*Primary Examiner*—Tuan H. Nguyen
*Attorney, Agent, or Firm*—David M. Driscoll; James H. Morris; Brett N. Dorny

[57] ABSTRACT

There is described a bipolar power transistor with high breakdown voltage, obtained in a heavily doped semiconductor substrate of the N type, over which a lightly doped N type layer, constituting a collector region of the transistor, is superimposed. The transistor has a base region comprising a heavily doped P type diffusion, which extends into the lightly doped N type layer from a top surface. The transistor further includes an emitter region constituted by a heavily doped N type diffusion extending from the top surface within said heavily doped P type diffusion. The heavily doped P type diffusion is obtained within a deep lightly doped P type diffusion, extending from said top surface into the lightly doped N type layer and formed with acceptor impurities of aluminum atoms.

21 Claims, 2 Drawing Sheets

PROCESS FOR MANUFACTURING A BIPOLAR POWER TRANSISTOR HAVING A HIGH BREAKDOWN VOLTAGE

This application is a division of application Ser. No. 08/266,029, filed Jun. 27, 1994, entitled BIPOLAR POWER TRANSISTOR WITH HIGH COLLECTOR BREAKDOWN VOLTAGE AND RELATED MANUFACTURING PROCESS, now pending.

BACKGROUND OF THE INVENTION

1. Field of the Invention

The present invention relates to a bipolar power transistor with high collector breakdown voltage and a corresponding manufacturing process.

2. Discussion of the Related Art

In bipolar power transistors fabricated by planar technology the collector region sustains almost the entire reverse voltage applied to the base-collector junction. This is a consequence of the electric field distribution across the junction, which depends on the doping concentration profile of the transistor's base region.

Because of this limitation, prior art, high voltage bipolar transistors do not use a planar structure. Rather they use a so-called "mesa" structure in which each transmitter resembles a little mesa whose vertical walls terminate the base-collector junction.

One of the basic technologies by which mesa transistors are fabricated is known as MultiEpitaxial Mesa ("MEM"). In the MEM technology, the base region comprises a lightly doped P– epitaxial layer, grown over an N– epitaxial layer (from which comes the name of the technology). A P+ region is then diffused therein, see e.g., (article title), *Solid State Technology*, Mar. 1976 at 29–32. The corresponding base doping concentration profile causes a significant percentage of the total reverse voltage applied to the base-collector junction to be sustained by the P– epitaxial portion of the base region, i.e., not the N– epitaxial collector only. The electric field distribution in both the base and the collector regions determines some of the electrical characteristics of the transistor, such as the gain dependance on the collector current and the ruggedness in secondary breakdown and in direct breakdown.

Even though this technology allows the fabrication of transistors with collector breakdown voltages up to 2000 V, it involves the passivation of the base-collector junction with glass. The glass is deposited in an annular moat, obtained by etching the silicon down to the N– epitaxial layer, a complex and expensive process. The moat, circumscribing each transistor to isolate its base from the other transistors' bases, gives rise to the mesa structure of the transistor. Mesa transistors exhibit low reliability with respect to transistors obtained by planar technologies, in which the base-collector junction is passivated by means of thermal oxide.

In view of the state of the art described, an object of the present invention is to provide a bipolar power transistor obtained with a planar manufacturing process and which has a high base-collector breakdown voltage and has an electric field distribution in the base region Like that of mesa technology.

SUMMARY OF THE INVENTION

According to the present invention, objects are achieved by means of a bipolar power transistor with a high breakdown voltage. The transistor comprises a heavily doped semiconductor substrate of the N type, over which a lightly doped N type layer, constituting a collector region of the transistor, is superimposed. A base region of the transistor comprises a heavily doped P type diffusion, which extends into the lightly doped N type layer from a top surface. An emitter region of the transistor includes a heavily doped N type diffusion extending from the top surface within the heavily doped P type diffusion. The heavily doped P type diffusion, is obtained within a deep, lightly doped P type diffusion, extending from said top surface into the lightly doped N type layer and formed with acceptor impurities of aluminum atoms, for example.

In a preferred embodiment of the invention, a plurality of merged concentric rings are provided around the deep lightly doped P type diffusion. Each ring is constituted by an annular P type region extending from the top surface into the lightly doped N type layer. In addition, each ring is formed with acceptor impurities of aluminum atoms and has a dopant concentration that is lower than that of the adjacent internal ring and higher than that of the adjacent external ring.

According to the invention, there is also provided a process for manufacturing the described bipolar power transistor. The process comprises the following steps:

a) growing a lightly doped N type epitaxial layer over a heavily doped semiconductor substrate of the N type;

b) growing oxide over a top surface of said epitaxial layer;

c) masked implanting of aluminum atoms into said epitaxial layer;

d) drive-in diffusing the aluminum atoms into the epitaxial layer to form a deep lightly doped P type base region;

e) masked implanting of a high concentration of acceptor dopants into said deep lightly doped P type base region;

f) drive-in diffusing the acceptor dopants into the deep lightly doped P type base region to obtain a heavily doped P type base region within the deep, lightly doped P type base region;

g) masked implanting of a high concentration of donor dopants into said heavily doped P type base region; and h) drive-in diffusing the donor dopants into the heavily doped P type base region to obtain a diffused heavily doped emitter region.

According to the present invention, it is possible to produce bipolar power transistors with planar structure, which have a base doping profile similar to that of mesa transistors obtained in MEM technology and which show high breakdown voltages.

BRIEF DESCRIPTION OF THE DRAWINGS

The features of the present invention shall be made more evident by the following detailed description of its preferred embodiment, illustrated as a non-limiting example in the annexed drawings, wherein.

DETAILED DESCRIPTION

Figure 1:
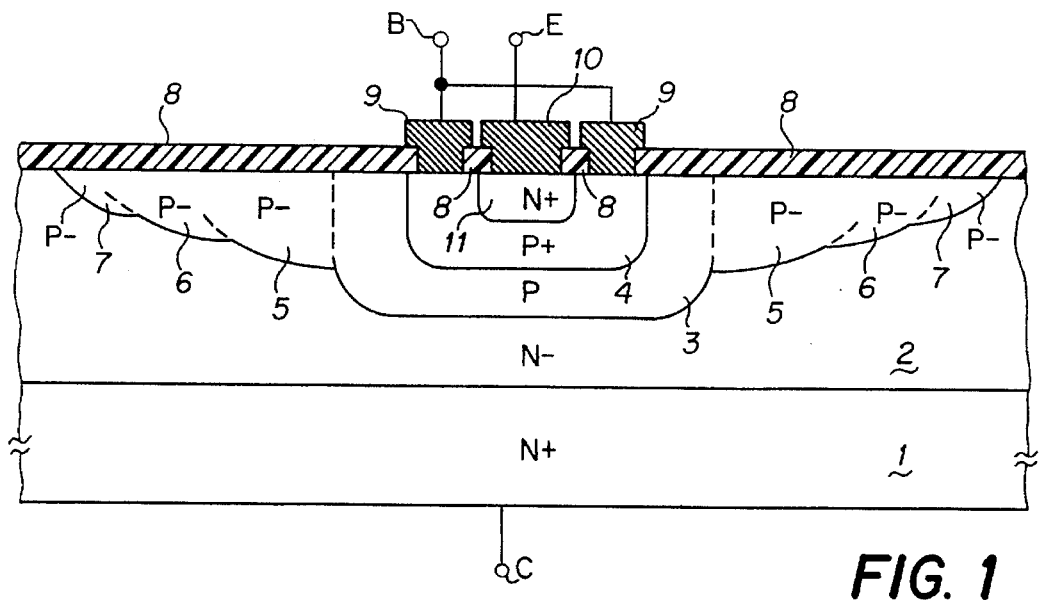
FIG. 1 is a cross-sectional view of a bipolar power transistor according to the preferred embodiment of the invention.

With reference to FIG. 1, a bipolar power transistor according to the invention is formed in a semiconductor substrate 1 of the N+ type, generally with (111) crystal orientation. Over the substrate 1 there is superimposed a lightly doped N-type epitaxial layer 2, having dopant concentration ranging from $10^{13}$ to $10^{14}$ atoms per $cm^3$ and a thickness of 100–150 μm. The epitaxial layer 2, together with the semiconductor substrate 1, forms a collector region of the bipolar power transistor.

A deep, aluminum-doped p type region 3 extends from a top surface into the epitaxial layer 2 to a depth of approximately 30–40 μm. In addition, a heavily doped P+ type region 4, doped for example with boron, extends from the top surface within the deep P type regions 3 to a depth of about 10 μm. The P+ type region 4, together with the P type deep region 3, forms a base region of the bipolar power transistor.

A heavily doped N+ type region 11 extends from the top surface within the P+ type region 4 and forms an emitter region of the bipolar power transistor.

Three concentrical rings 5, 6, and 7, constituted by lightly doped P type aluminum-doped regions, extend from the top surface into the epitaxial layer 2 and around the deep P type region 3. The dopant concentration of the ring 5 is higher than that of the ring 6, which, in turn, has a dopant concentration higher than that of the ring 7.

An insulating oxide layer 8 is superimposed over the top surface, and contact areas are provided to allow strips 9 and 10 of a conductive layer to contact the P+ type region 4 and the N+ type region 11, respectively. The strip 9 is connected to a base terminal B, and the strip 10 is connected to an emitter terminal E. The substrate 1 is also connected to a collector terminal C.

Figure 2:
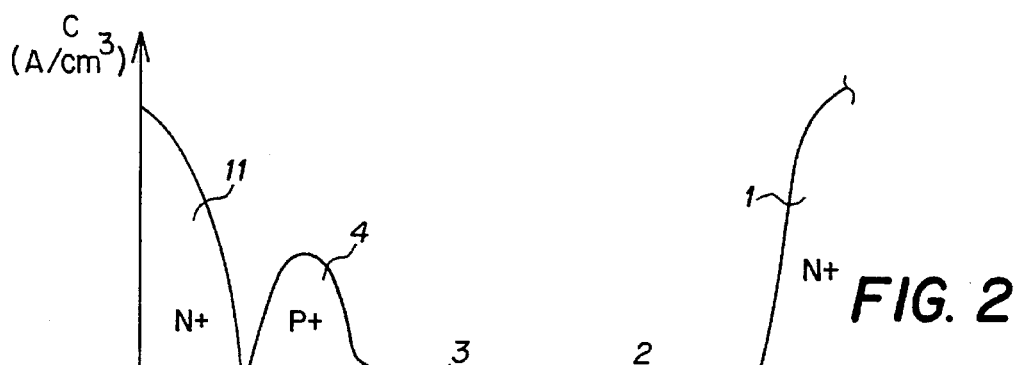
FIG. 2 is a doping concentration profile diagram (Concentration versus Depth) of said bipolar power transistor.
Figure 3:
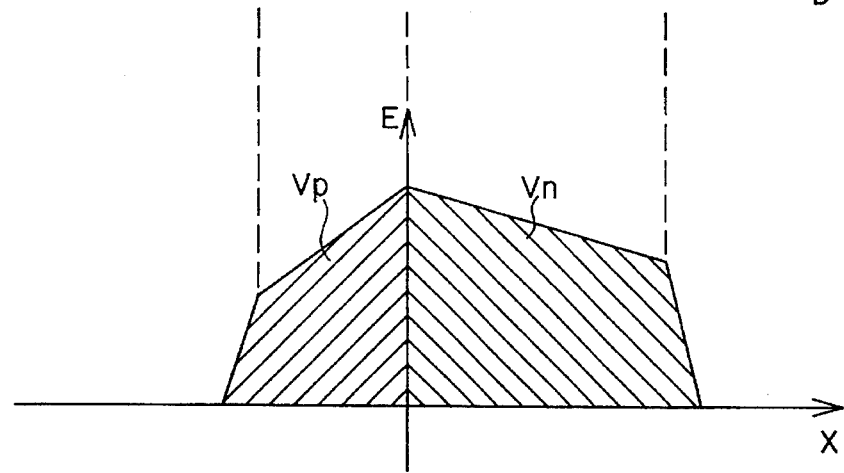
FIG. 3 is a diagram (Electric field versus Distance from the base-collector junction) showing the electric field distribution across a reverse-biased base-collector junction.

Because aluminum in silicon behaves as an acceptor dopant and has a high diffusivity (approximately ten times higher than the diffusivity of boron), it is possible to obtain a deep base-collector junction having the dopant concentration profile shown in FIG. 2. The base region has a high dopant concentration near the emitter-base junction (region 4), suitable to achieve low base resistance. Near the base-collector junction (region 3), however, the base dopant concentration is much lower and comparable with that of the epitaxial layer 2. This allows the base region to sustain a significant part of the total reverse voltage applied to the base-collector junction and, consequently, leads to a higher breakdown voltage, since the peak value of the electric field at the metallurgical junction diminishes. This is shown in FIG. 3, in which Vp and Vn are the fractions of the total reverse voltage applied to the base-collector junction sustained by the base and collector regions respectively. These voltages are given by the areas subtended by the electric field distribution in the two regions.

Unlike other high-diffusivity species, aluminum does not introduce deep states responsible for an increase in leakage currents and, consequently, a decrease in the transistor's current gain.

Lightly doped rings 5, 6, and 7 lead to a further increase in the base-collector breakdown voltage, because the rings reduce the edge effects on the electric field by smoothing the corners of the P type region 3.

Figure 4:
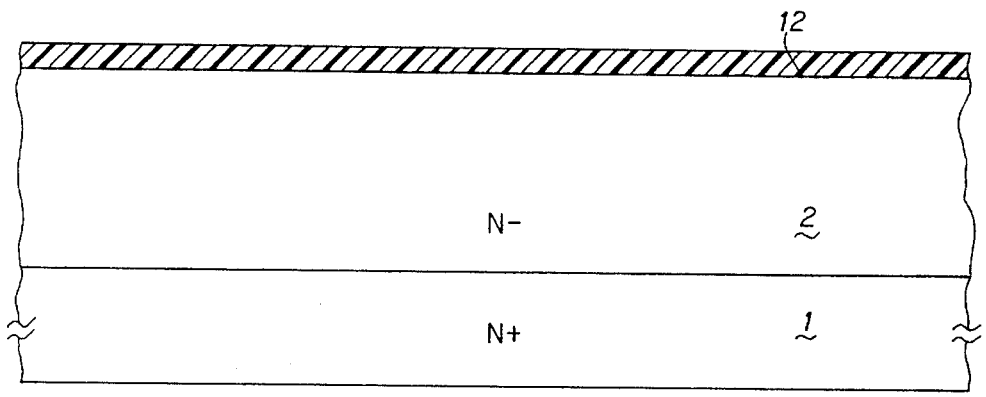
FIGS. 4 to 7 are cross-sectional views of the bipolar power transistor taken at intermediate steps of the manufacturing process according to the invention.
Figure 5:
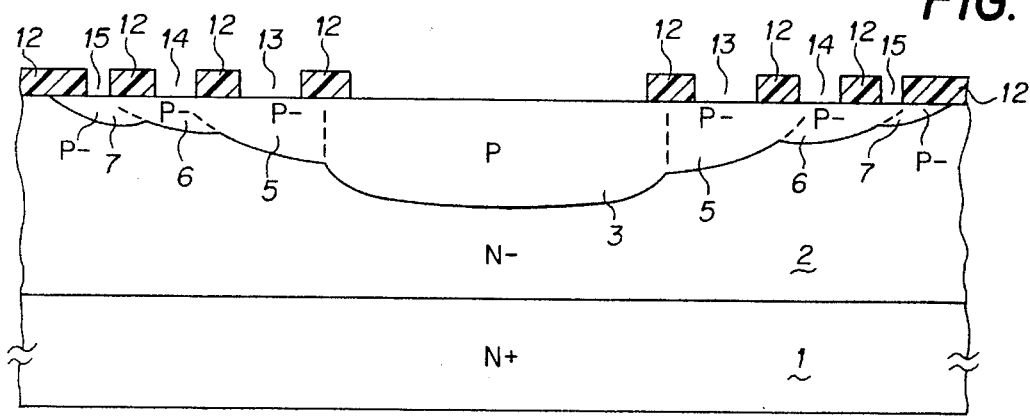

The manufacturing process according to the present invention starts with the growth of the N− epitaxial layer 2 over the N+ semiconductor substrate 1. After the oxidation of the entire top surface of the epitaxial layer 2 (FIG. 4), the oxide layer 12 thus formed is selectively etched, and aluminum atoms are implanted into selected areas of the epitaxial layer 2. With a subsequent drive-in diffusion step, the deep P type regions 3 and the rings 5, 6, and 7 are simultaneously formed (FIG. 5). The higher dopant concentration of ring 5 with respect to ring 6, and of ring 6 with respect to ring 7, is achieved by etching the oxide layer 12 to form annular windows 13, 14, and 15 with decreasing area, so as to decrease the aluminum total amount of implanted into silicon (FIG. 5).

From this point on, the process is similar to a traditional planar process.

Figure 6:
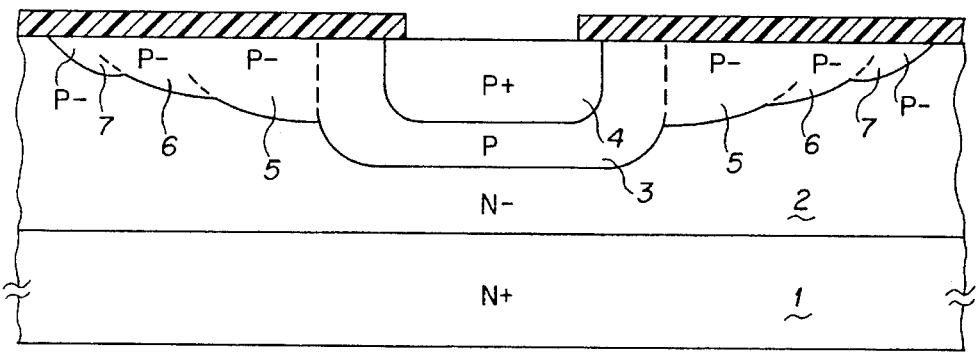

After the oxidation of the top surface, a high dose of boron is selectively implanted into the deep P type region 3. A subsequent drive-in diffusion allows the formation of the heavily doped P+ type region 4, and the simultaneous further diffusion of the aluminum atoms of region 3 makes it possible to achieve a base-collector junction depth of about 30–40 μm (FIG. 6).

Figure 7:
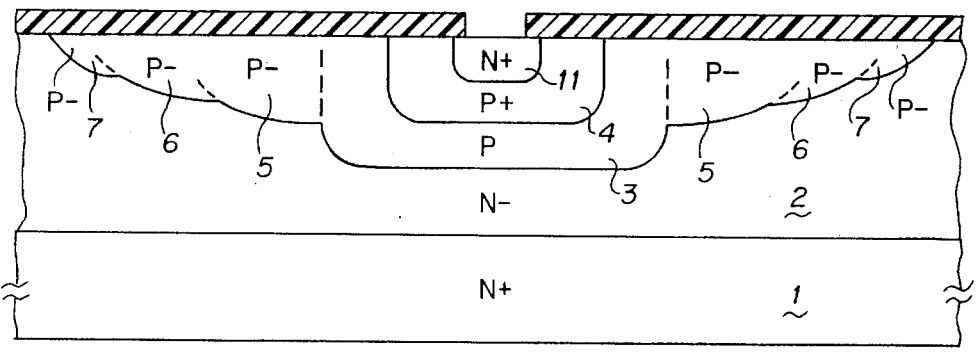

A further oxidation of the top surface is then performed, and donor impurities are selectively implanted into the P+ type region 4 to form, after a drive-in diffusion, the heavily doped N+ emitter region 11 (FIG. 7).

After the definition of contact areas (FIG. 1), a conductive layer is deposited over the entire surface and selectively removed to allow the formation of the strips 9 and 10. An electrical contact to the bottom surface of the substrate 1 is also provided.

The surface of the chip is finally passivated, for example by means of silicon nitride.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A process for manufacturing a bipolar power transistor having a high breakdown voltage, the process comprising the steps of:

a) growing a lightly doped N type epitaxial layer over a heavily doped semiconductor substrate of the N type;

b) growing oxide over a top surface of said lightly doped N type epitaxial layer;

c) masked implanting of aluminum atoms into said lightly doped N type epitaxial layer;

d) drive-in diffusing said aluminum atoms into said lightly doped N type epitaxial layer to form a lightly doped P type base region;

e) masked implanting of a high concentration of acceptor dopants into said lightly doped P type base region;

f) drive-in diffusing said acceptor dopants into said lightly doped P type base region to obtain a heavily doped P type base region within said lightly doped P type base region;

g) masked implanting of a high concentration of donor dopants into said heavily doped P type base region; and h) drive-in diffusing said donor dopants into said heavily doped P type base region to obtain a diffused heavily doped emitter region.

2. The process according to claim 1, further including the step of forming a plurality of P type aluminum-doped concentrical rings around and simultaneously to said lightly doped P type base region.

3. The process according the claim 2, wherein the step of forming ensures that said rings have a dopant concentration which diminishes going from a most internal ring to a most external ring.

4. The process according to claim 3, characterized in that said rings with dopant concentration which diminish going from a most internal ring to a most external ring are formed by implanting said aluminum atoms through annular windows in a mask layer having decreasing area going from said most internal ring to said most external ring, to progressively decrease a total amount of aluminum atoms implanted into the N type epitaxial layer going from the most internal ring to the most external ring.

5. The process according to claim 1, wherein said acceptor dopants are ions of boron.

6. A method for manufacturing a bipolar power transistor, the method comprising the steps of:

a) growing a collector region on a semiconductor substrate;

b) growing an oxide on a top surface of the collector region;

c) implanting impurity atoms into the collector region via a first mask;

d) drive-in diffusing the impurity atoms into the collector region to form a first portion of a base region in the collector;

e) implanting a concentration of dopants into the first portion of the base region via a second mask:

f) drive-in diffusing the dopants to form a heavily doped second portion of the base region within but not extending through the first portion;

g) implanting a concentration of dopants of a second type into the second portion via a third mask; and h) drive-in diffusing the dopants of the second type into the second portion of the base region to obtain a heavily doped emitter region.

7. The method of claim 6, further including the step of forming a plurality of concentrical rings around the first portion of the base region, each ring being of a similar semiconductor type as the first portion, and each ring having a dopant concentration that diminishes as the rings extend outwardly from the first portion.

8. The method of claim 7 wherein the step of forming a plurality of concentrical rings is done simultaneously with step (d).

9. The method of claim 8 wherein the first mask has openings to form each ring, and inner rings having a larger opening than a subsequent outer ring.

10. The method of claim 6 wherein:
the semiconductor substrate has a diffusivity; and
step (c) includes implanting impurity atoms having a high diffusivity in relation to the diffusivity of the semiconductor substrate.

11. The method of claim 10 wherein the impurity atoms are aluminum.

12. The method of claim 6, wherein step e) includes implanting boron atoms into the first portion of the base region.

13. The method of claim 6, wherein:
step c) includes implanting an amount of impurity atoms so that step d) results in a first concentration of impurity atoms in the first portion of the base region;
step e) includes implanting an amount of dopants so that step e) results in a second concentration of dopants in the second portion of the base region that is greater than the first concentration of impurity atoms in the first portion of the base region.

14. A method for manufacturing a bipolar power transistor, comprising the steps of:

forming a collector region in a substrate;

forming a first diffused portion of a base region adjacent the collector region, the first diffused portion having a first concentration of impurities of a first type;

subsequently forming a second diffused portion of the base region within the first diffused portion, the second diffused portion having a second concentration of impurities of the first type, the second concentration being greater than the first concentration; and forming an emitter region within the second diffused portion of the base region.

15. The method of claim 14, wherein the step of forming a second diffused portion includes forming the second diffused portion so that the first diffused portion remains adjacent the collector region.

16. The method of claim 14, wherein the step of forming the first diffused portion includes forming the first diffused portion with acceptor impurities.

17. The method of claim 16, wherein the step of forming the first diffused portion includes forming the first diffused portion with aluminum atoms.

18. The method of claim 14, wherein the step of subsequently forming a second diffused portion includes forming the second diffused portion with boron.

19. The method of claim 14, further comprising a step of forming a plurality of concentric rings about the first portion of the base region, each ring having impurities of the first type and having a respective dopant concentration, wherein the dopant concentration in each ring is less than a dopant concentration of any rings closer to the first portion.

20. The method of claim 14, wherein the step of forming the first diffused portion includes the steps of:
implanting a first dose of impurities of the first type via a first mask; and
diffusing the first dose of impurities.

21. The method of claim 20, wherein the step of subsequently forming the second diffused portion includes the steps of:
implanting a second dose of impurities of the first type via a second mask that is different from the first mask; and
diffusing the second dose of impurities.

* * * * *

UNITED STATES PATENT AND TRADEMARK OFFICE
CERTIFICATE OF CORRECTION

PATENT NO. : 5,569,612
DATED : October 29, 1996
INVENTOR(S) : Ferruccio Frisina, et. al.

It is certified that error appears in the above-indentified patent and that said Letters Patent is hereby corrected as shown below:

Title page, item [75], inventors: should read as following--Ferruccio Frisina, Sant Agata Li Battiati; Salvatore Coffa, Tremestieri Etneo, both of Italy--.

Title page, item [73], Assignee: should read as following--Consorzio Per la Ricerca sulla Microelettronica nel Mezzogiorno, Catania, Italy--.

Signed and Sealed this

Twenty-sixth Day of August, 1997

Attest:

BRUCE LEHMAN

Attesting Officer

Commissioner of Patents and Trademarks